United States Patent [19]
Peidous

[11] Patent Number: 5,989,978
[45] Date of Patent: Nov. 23, 1999

[54] SHALLOW TRENCH ISOLATION OF MOSFETS WITH REDUCED CORNER PARASITIC CURRENTS

[75] Inventor: Igor V. Peidous, Singapore, Singapore

[73] Assignee: Chartered Semiconductor Manufacturing, Ltd., Singapore, Singapore

[21] Appl. No.: 09/116,610

[22] Filed: Jul. 16, 1998

[51] Int. Cl.⁶ .................................... H01L 21/8224
[52] U.S. Cl. .................... 438/436; 438/424; 438/435; 438/437; 438/438
[58] Field of Search .................... 438/424, 435, 438/436, 437, 438

[56] References Cited

U.S. PATENT DOCUMENTS

| | | | |
|---|---|---|---|
| 5,447,884 | 9/1995 | Fahey et al. | 437/67 |
| 5,492,858 | 2/1996 | Bose et al. | 437/67 |
| 5,641,704 | 6/1997 | Paoli et al. | 438/436 |
| 5,643,823 | 7/1997 | Ho et al. | 437/67 |

Primary Examiner—Wael Fahmy
Assistant Examiner—Long Pham
Attorney, Agent, or Firm—George O. Saile; Rosemary L. S. Pike

[57] ABSTRACT

A method is described for forming MOSFETs with shallow trench isolation wherein the abrupt corners introduced by anisotropically etching the silicon trenches are modified by an oxidation step which rounds off the corners and also reduces the effect of tensile stresses caused by the densified trench filler material. The method selectively exposes the corner regions to an oxidation whereby the formation of an oxide birdsbeak modulates the corners and introduces a compressive stress component in the corner region. Several variations of the procedure are disclosed, including embodiments wherein birdsbeaks extending in both a vertical and horizontal directions from the corners are employed. The channel and gate oxide edges of MOSFETs extend to these corners. By attenuating the abrupt corners and reducing the mechanical stresses, gate oxide integrity is improved and anomalous sub-threshold currents of MOSFETs formed are abated.

22 Claims, 8 Drawing Sheets

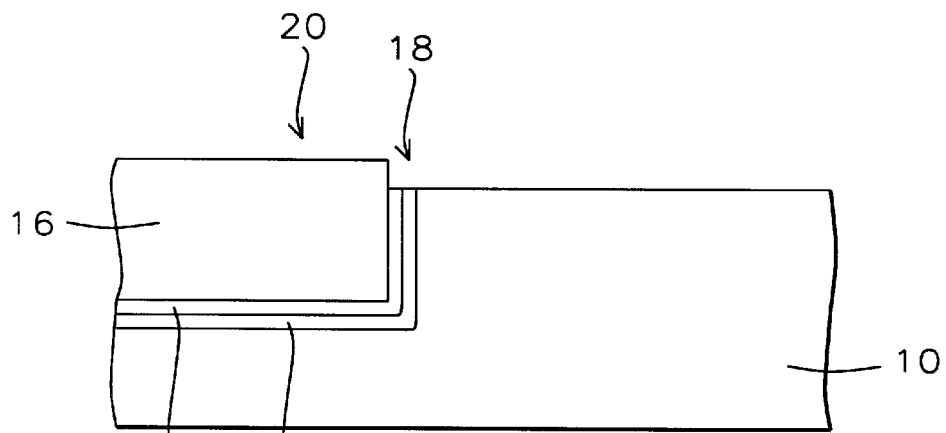
FIG. 1 — Prior Art
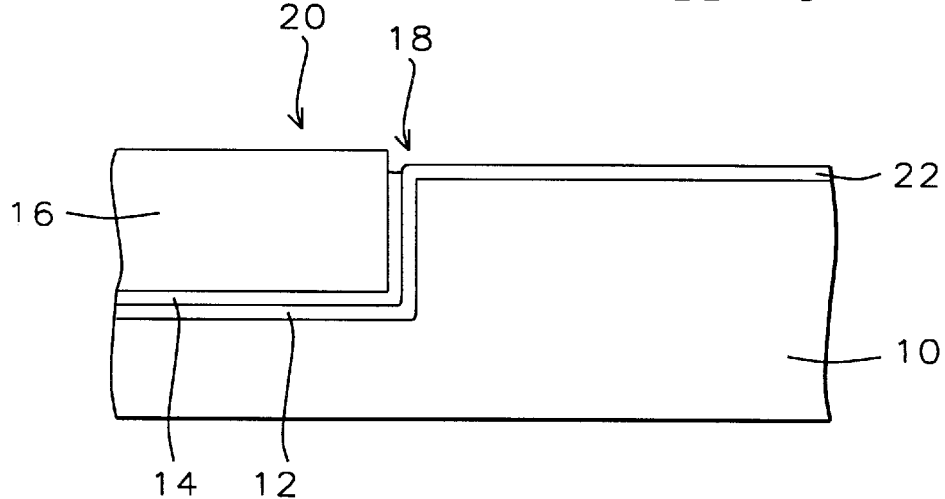
FIG. 2 — Prior Art
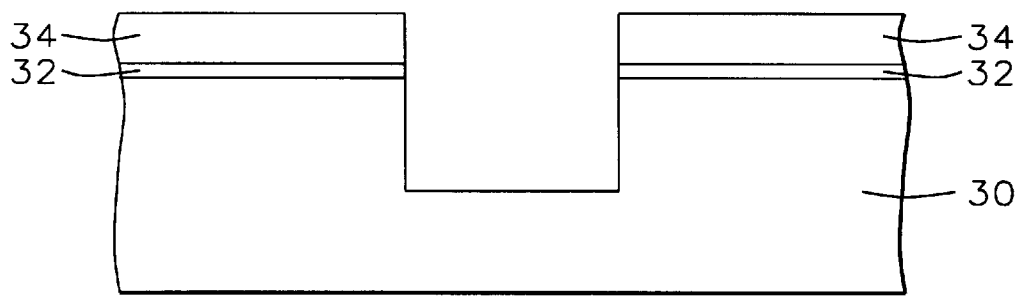
FIG. 3A

SHALLOW TRENCH ISOLATION OF MOSFETS WITH REDUCED CORNER PARASITIC CURRENTS

BACKGROUND OF THE INVENTION (1) Field of the Invention

The invention relates to processes for the manufacture of semiconductor devices and more particularly to processes for forming field isolation.

(2) Description of Prior Art

The formation of integrated circuit devices on silicon substrates requires that a means be provided to electrically isolate the various circuit components from each other. To this end regions of field insulation, typically of silicon oxide, are formed adjacent to the circuit components.

The well known method of local oxidation of silicon (LOCOS) to form field oxide isolation around semiconductive devices built into the surface of silicon wafers has been practiced for over twenty-five years and has served well to provide field isolation for many applications. Over the years many problems with LOCOS have surfaced which have been addressed in a great variety of ways. Most notable are the problems which deal with the growth of oxide under the hardmask used to define the oxide regions and the resultant uneven surface topology over the field oxide. The oxide penetration under the mask is commonly referred to as birdsbeak. These problems still persist and become aggravated as the technology tends towards smaller, shallower devices at high densities.

A promising replacement for LOCOS field oxide isolation has been found in trench isolation. Although deep trench isolation(DTI) has been used nearly as long as LOCOS for bipolar transistor isolation, it has not been widely practiced in the manufacture of CMOS (complimentary metal oxide silicon) integrated circuits. More recently, however, as device densities increase and isolation widths become smaller, shallow trench isolation(STI) is gaining favor over LOCOS in CMOS technology. The Trenches are formed in the silicon around the semiconductor devices by reactive ion etching. They are then filled either entirely with silicon oxide or lined with thermal silicon oxide and filled with another material such as polysilicon. The thin (<200 Å) thermal silicon oxide liner is included even when the trench filler material is an insulator.

Unlike LOCOS field isolation, the geometric features of STI are generally more abrupt, presenting sharp corners at both the top and bottom of the trenches. The sharp features, although welcomed by the smaller and denser circuit designs, aggravate device performance issues which are stress related. In particular, major problems are encountered when STI is used in CMOS technology that are caused by electric field crowding at the edges of the active device regions. These problems include anomalous sub-threshold conduction and poor gate oxide integrity. In addition, tensile stresses are induced in the devices themselves by shrinkage of the trench filling oxide through densification of the oxide during subsequent annealing.

A recent innovation in STI technology has been the incorporation of a silicon nitride liner over the thin thermal silicon oxide liner. The silicon nitride liner acts as an oxidation barrier during a pyrogenic oxide anneal which enables improved densification of the filler oxide. Such a technique was introduced by Fahey, et.al. U.S. Pat. No. 5,447,884 wherein a silicon nitride liner less than 5 nm. thick was deposited over the thermal oxide. A pyrogenic anneal(wet oxidation conditions) permitted densification of the oxide filler at lower temperatures than the conventional argon anneal. In addition the wet oxidation step removed fluorine which was not the case with an argon anneal. Ho, et.al., U.S. Pat. No. 5,643,823 crystallized the amorphous as deposited silicon nitride liners by rapid thermal anneal (RTA), thereby permitting the use of thicker silicon nitride liners without incurring undercutting by wet etches which are used to remove a pad nitride layer used as the RIE (reactive ion etching) hardmask for etching the silicon trench. Bose, et.al., U.S. Pat. No. 5,492,858 also introduced a silicon nitride liner in an STI process wherein the liner served not only as an oxidation barrier during steam densification of the filler oxide, but also provided a more receptive surface than the thermal oxide to form a more durable bond with the conformal dielectric filler material.

After the filler oxide has been deposited and densified by pyrogenic annealing as taught by the prior art, the silicon nitride hardmask used for the trench RIE and the accompanying pad oxide are removed by wet etching, leaving a structure which is shown in a cross section of the wafer 10 in FIG. 1. The trench 20 has been filled with LPCVD silicon oxide and densified by annealing. The pad oxide 12 and the silicon nitride liner 14 remain under the filler oxide 16. Also shown in FIG. 1 is a slight undercut of the pad oxide adjacent to the sharp upper silicon corner 18, which is likely to occur since the pad oxide is removed a wet etch.

The sharp corner 18, which is not addressed by the prior art, is conventionally ignored and a gate oxide 22 is grown over the exposed silicon active area. The gate oxide thus formed is thinner at the sharp corner 18 than over the planar region. This creates a gate oxide integrity risk along the edges of the active channel region. In addition, the tensile stresses in the densified filler oxide extend stresses into the channel region, thereby causing crystalline distortions and defects in the channel region which result in anomalous currents and leakages in subsequently formed MOSFETs.

Paoli, et.al., U.S. Pat. No. 5,641,704 shows a method for forming STI using trench liners and planarization but does not address problems related to the abrupt corners at the edges of channel regions of MOSFETs encountered in the process.

The application of spacers along the edge of the filler oxide may be used to offset the edge of the channel region from the sharp corner, however, the dimensions of these spacers would be comparable with the widths of narrow channel devices and would consequently reduce the drive current capabilities of these devices.

SUMMARY OF THE INVENTION

It is an object of this invention to provide a method for improving the electrical characteristics of MOSFETs with channel regions defined and isolated by shallow trench isolation.

It is another object of this invention to provide a method for attenuating the effects of tensile stresses in insulative filler materials in shallow trenches on active channel regions adjacent to said trenches.

It is yet another object of this invention to provide a method for forming a MOSFET isolated by STI with reduced mechanical stress, improved gate oxide integrity, and reduced electric field crowding at channel edges.

These objects are accomplished by forming a liner consisting of silicon nitride over a pad oxide in said trenches prior to the deposition of a trench filler material. Then after depositing, densifying, and planarizing the filler material, exposing the upper outside corners of said trenches to an oxidation wherein the outside corners are oxidized and rounded. A vertical oxide birdsbeak is formed under the silicon nitride trench liner. The vertical birdsbeak introduces a compressive stress which counteracts the tensile stresses of the filler oxide. The oxide is etched away over the planar regions adjacent to the outside corner leaving small pockets in the corner regions. A gate oxide is then grown in a conventional fashion and a MOSFET is formed by patterning a gate electrode over the gate oxide and forming source/drain regions in the silicon by well known customary procedures.

It is yet another object of this invention to provide a method for specifically and exclusively oxidizing a region at an outside corner of a silicon structure.

It is yet another object of this invention to provide a method for rounding off an outside silicon corner of a silicon structure.

These objects are accomplished by providing an oxidation hardmask which selectively exposes only the outside corners of the silicon structures to an oxidation process, whereby the corners are rounded by birdsbeak formation.

BRIEF DESCRIPTION OF THE DRAWINGS

FIG. 1 is a cross section of silicon wafer showing a shallow trench lined with oxide/nitride layers and filled with a insulator.

FIG. 2 is a cross section of silicon wafer showing an oxide filled shallow trench lined with oxide/nitride layers and provided with a gate oxide formed according to a conventional process.

FIG. 3A through FIG. 3E are cross sections of a wafer showing the processing steps of a first embodiment of this invention.

DESCRIPTION OF THE PREFERRED EMBODIMENTS

Figure 3B:
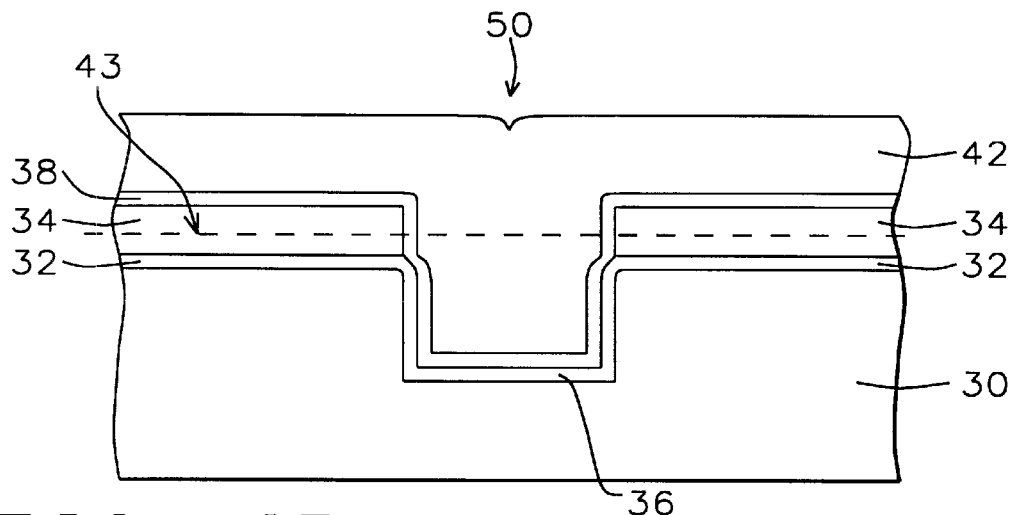

In a first embodiment of this invention a <100> oriented monocrystalline p-type silicon wafer is provided. Referring to FIG. 3A, there is shown a cross section of the silicon wafer 30. A layer of silicon oxide(pad oxide) 32 is thermally grown on the wafer 30 to a thickness of between about 10 and 30 nm. by subjecting the wafer to a clean dry oxidizing ambient in a furnace at 800° C. or thereabout. A first silicon nitride layer (pad nitride) 34 between about 100 and 300 nm. thick is then deposited on the pad oxide layer 32, preferably by low pressure chemical vapor deposition (LPCVD).

An opening 40 is next patterned in the pad nitride layer 34 and the pad oxide layer 32 by conventional photolithographic methods well known to those in the art, thereby forming a hardmask. The opening 40 in the hardmask is then extended to a depth of between about 270 and 450 nm into the silicon substrate 30 by RIE. The practice of etching essentially vertical walled trenches into silicon substrates is a well developed art and is typically accomplished by the use of etchant gases containing chlorine or $SF_6$.

Referring now to FIG. 3B, a layer of silicon oxide 36 is next grown on the exposed trench surfaces. The silicon oxide layer 36 is grown in a clean dry oxidizing ambient in a furnace at between about 850 and 950° C. to a thickness of between about 10 and 20 nm. A silicon nitride layer 38 between about 20 and 60 nm. thick is then deposited conformally over the wafer, preferably by LPCVD. The nitride layer 38 serves to protect the clean oxide trench liner 36 from contamination in further processing and also acts as an oxidation barrier to prevent oxidation of the silicon trench walls during subsequent densification of the trench filler oxide. In addition, as will later become clear, the nitride layer 38 also controls oxidation of the trench sidewalls at the active trench upper corner.

A layer of silicon oxide 42 is next deposited, preferably by LPCVD, filling the trench opening 50. The trench oxide, is preferably deposited by the thermal decomposition of tetraethoxy orthosilicate(TEOS) which is conformal and may be accomplished at temperatures between 650 and 800° C. Optionally, other precursors, for example, $SiH_4$ and $O_2$ may be used to form the filler oxide 42. The trench filler material may also consist of a substance other than silicon oxide, for example a silicate glass or polysilicon. The deposition procedures for these various materials is well understood by those practicing the art.

After deposition, the filler oxide 42 is densified by subjecting the wafer 30 to an ambient of wet oxygen or steam at a temperature of 800° C. or thereabout for a period of about 30 minutes. The surface of the wafer 30 is then subjected to a planarization process, preferably chemical mechanical polishing (CMP). The CMP removes the extraneous filler material over the planar regions of the wafer and is accomplished until the surface of the wafer is polished into the pad nitride layer 34. The final wafer surface after CMP is represented in FIG. 3B by the dashed line 43. Alternative methods of planarization such as reactive ion etchback may also be employed. CMP and other planarization methods are well known and widely practiced. The filler oxide densification step may alternately be performed after the planarization step. Stress considerations which depend upon the filler material used may influence the preferred sequence of these two steps.

Figure 3C:
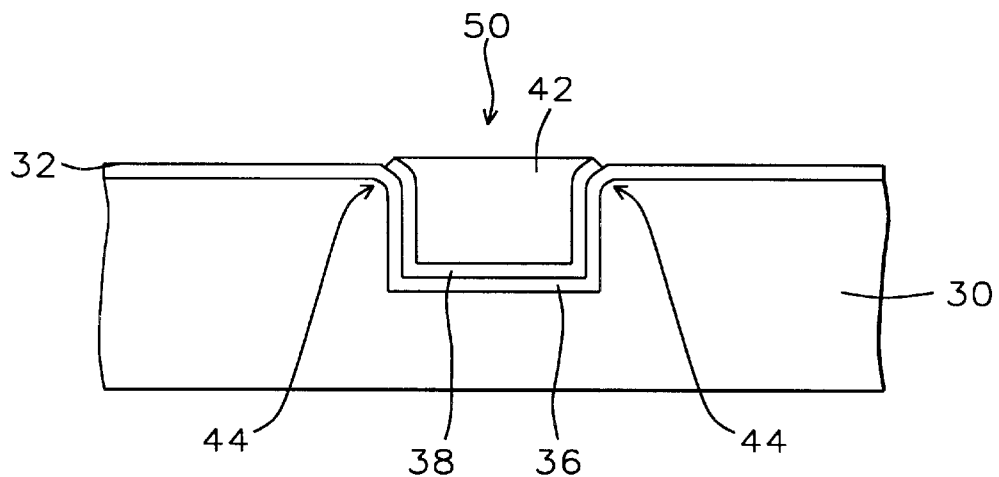

The remaining pad nitride 34 is next removed, preferably by wet etching in hot $H_3PO_4$. Selective removal of silicon nitride layers by dissolution in hot $H_3PO_4$ is well known in the art and is widely practiced. Alternatively, a plasma etching technique may be employed whereby the pad oxide 36 is used as an etch stop. The resultant cross section is shown in FIG. 3C. The pad oxide 36 is preferably left in place at this point to be removed after the subsequent oxidation step. Alternately it may be removed at this juncture with dilute HF.

Figure 3D:
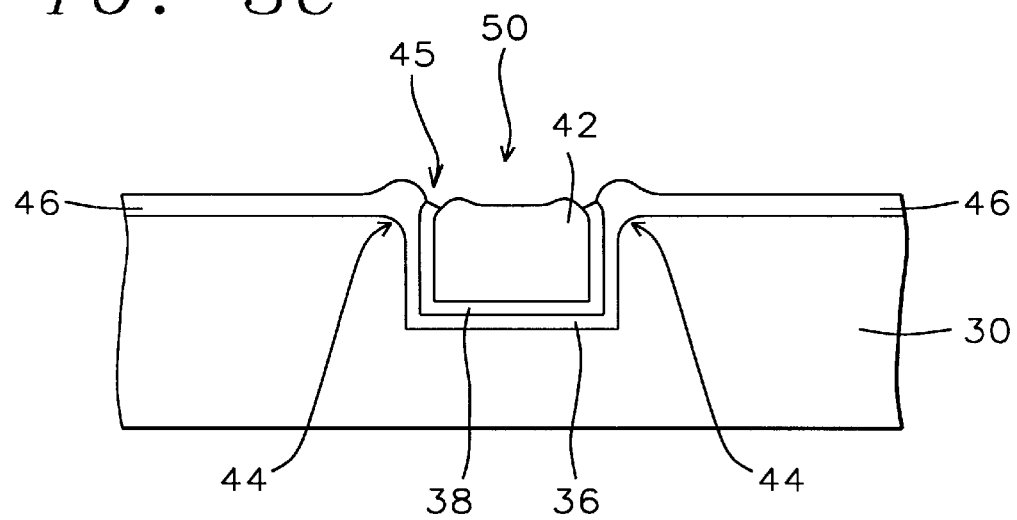

Referring now to FIG. 3D, the wafer 30 is subjected to an oxidation step wherein a sacrificial oxide 46 is grown on the exposed silicon surface. The sacrificial oxide also includes the pad oxide 32 if it was not previously removed. The oxidation is preferably performed in dry oxygen at a temperature of between about 850 and 950° C. A silicon oxide film 46 between about 20 and 50 nm. in thickness is grown on the silicon surface. In addition to the oxide film 46 grown over the planar portions of the exposed silicon, the oxidizing species also penetrate the exposed edge of the pad oxide 36. This causes the sharp corners 44 to be oxidized in both the vertical and horizontal direction. The process is analogous to the familiar birdsbeak formation which is common observed in LOCOS and has been hereinbefore cited. Indeed, the process as applied in this invention may be referred to as vertical birdsbeak.

In the LOCOS process, birdsbeak is generally an undesirable consequence and is minimized. However, as applied in the current invention, the formation of a vertical birds beak at the trench corners has two significant advantages. Firstly, the corners are rounded, thereby diffusing associated stress patterns. Secondly, the growth of oxide between the silicon at the corner and the silicon nitride liner 38 is accompanied by a volume expansion of approximately a factor of 2. The pressure exerted on the end 45 of the silicon nitride liner 38 by the volume increase pushes the edge of the liner into the filler oxide and thereby compensates the tensile stress in the densified filler oxide 42.

Figure 3E:
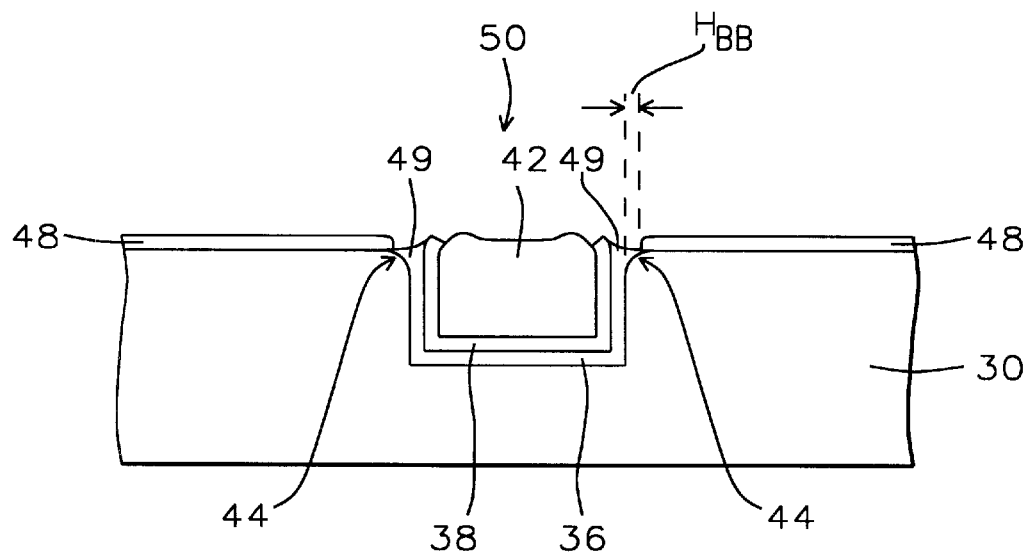

The silicon oxide film 46 is too thick to be used as a gate oxide and must therefore be removed. Referring now to FIG. 3E, the sacrificial oxide film 46 is removed from the planar regions of the silicon surface by etching with a calibrated wet etchant containing HF. Because the film is uniform(by virtue of being formed by oxidation), a calibrated dilute HF etchant can be controllably applied to etch only the planar portions of the oxide while leaving the deeper birdsbeak portions 49 intact. Suitable wet etchants having stable etch rates are widely used in the semiconductor industry and their means of calibration and utilization are well understood. After removal of the oxide film 46, a gate oxide 48 for the MOSFET devices is grown in the conventional manner. The gate oxide 48 adjoins the residual pocket 49 of the sacrificial oxide 46 in an essentially smooth transition. The height of the birdsbeak $H_{BB}$ is only about 50 nm. which constitutes a negligible consumption of active area, even at the narrowest of channel widths.

Following the formation of the gate oxide 48, a MOSFET is formed by patterning a gate electrode over the gate oxide 48, and forming source/drain regions in the silicon by well known customary procedures.

In a second embodiment a dual birdsbeak is formed to achieve corner rounding and stress compensation at the edge of the channel active area. In this embodiment the planar active surface is not oxidized during the birdsbeak formation and thus there is no additional consumption of silicon by sacrificial oxide over the main portion of the active area.

Figure 4A:
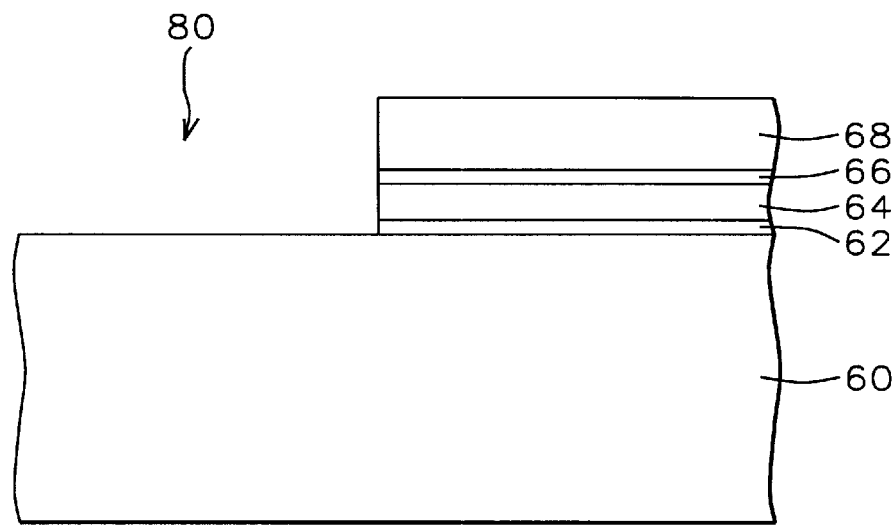
FIG. 4A through FIG. 4G are cross sections of a wafer showing the processing steps of a second embodiment of this invention.

A <100> oriented monocrystalline p-type silicon wafer is provided. Referring to FIG. 4A, there is shown a cross section of the silicon wafer 60. A layer of silicon oxide(pad oxide) 62 is thermally grown on the wafer 60 to a thickness of between about 10 and 20 nm. by subjecting the wafer to a clean dry oxidizing ambient in a furnace at between about 850 and 950° C. A first silicon nitride layer (thin nitride) 64 between about 50 and 100 nm. thick is then deposited on the pad oxide layer 62, preferably by low pressure chemical vapor deposition (LPCVD).

An etch stop layer 66 of silicon oxide is then deposited on the thin nitride layer 64 preferably by LPCVD to a thickness of 20 nm. or thereabout. The etch stop layer 66 may alternatively be formed of another material, for example, polysilicon. Alternate methods of deposition may also be employed, for example plasma enhanced chemical vapor deposition(PECVD). A second layer of silicon nitride (thick nitride) 68 is then deposited on the etch stop layer 66. The thick nitride layer 68 is deposited preferably by LPCVD to a thickness of between about 100 and 300 nm.

An opening 80 is next patterned in the thick nitride layer 69, the etch stop layer 66, the thin nitride layer 64 and the pad oxide layer 62 by conventional photolithographic methods well known to those in the art, thereby forming a composite hardmask. The opening 80 in the hardmask is then extended to a depth of between about 270 and 450 nm into the silicon substrate 60 by RIE. The practice of etching essentially vertical walled trenches into silicon substrates is a well developed art and is typically accomplished by the use of etchant gases containing chlorine or $SF_6$.

Figure 4B:
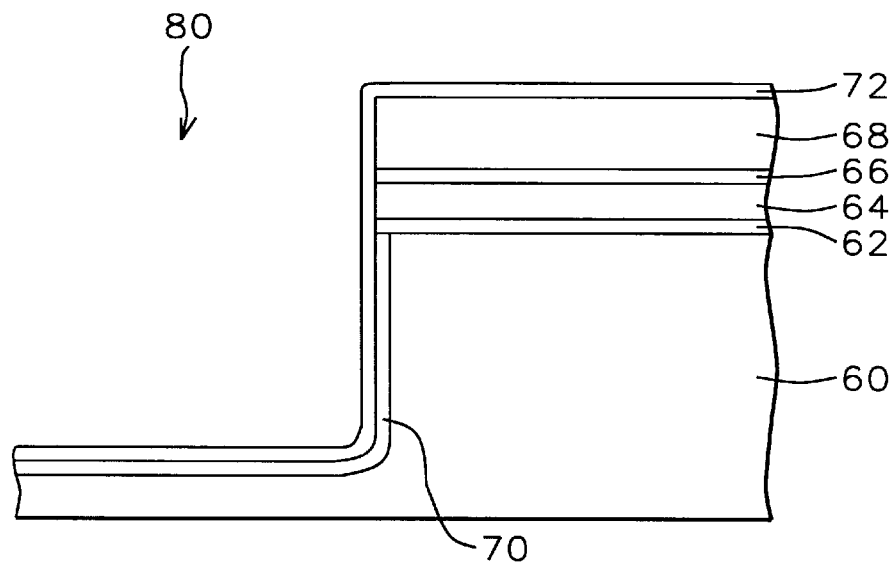

Referring now to FIG. 4B, a layer of silicon oxide 70 is next grown on the exposed trench surfaces. The silicon oxide layer 70 is grown in a clean dry oxidizing ambient in a furnace at about between about 850 and 950° C. to a thickness of between about 10 and 20 nm. A silicon nitride layer 72 between about 20 and 60 nm. thick is then deposited conformally over the wafer, preferably by LPCVD. The nitride layer 72 serves to protect the clean oxide trench liner 70 from contamination in further processing and also acts as an oxidation barrier to prevent oxidation of the silicon trench walls during subsequent densification of the trench filler oxide.

Figure 4C:
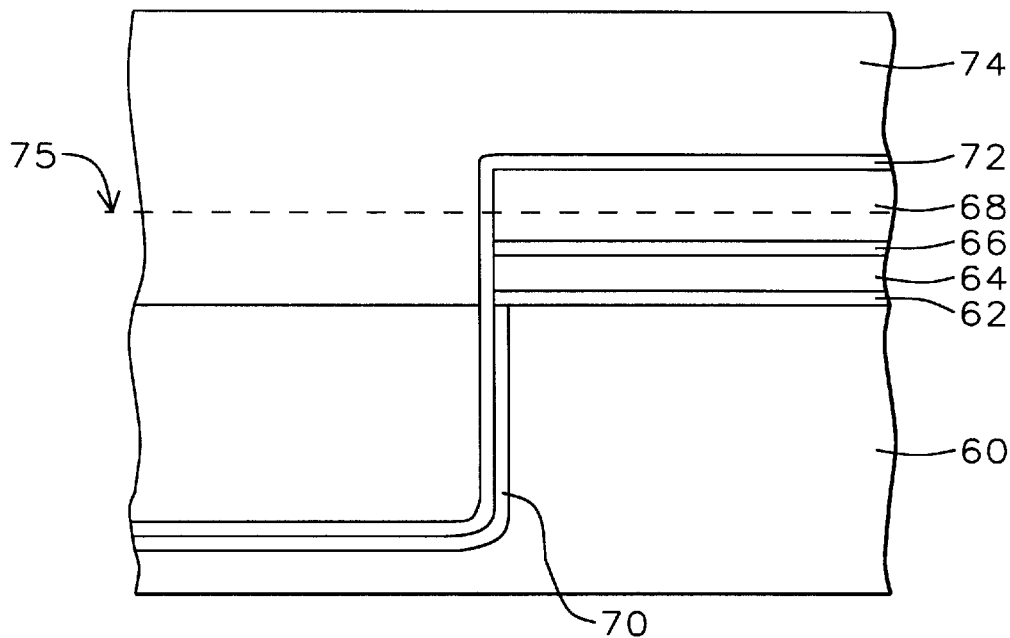

Referring next to FIG. 4C, a layer of silicon oxide 74 is next deposited, preferably by LPCVD, filling the trench opening 80. The trench oxide, is preferably deposited by the thermal decomposition of tetraethoxy orthosilicate(TEOS) which is conformal and may be accomplished at temperatures between 650 and 800° C. Optionally, other precursors, for example, $SiH_4$ and $O_2$ may be used to form the filler oxide 74. The trench filler material may also consist of a substance other than silicon oxide, for example a silicate glass or polysilicon. The deposition procedures for these various materials is well understood by those practicing the art.

After deposition, the filler oxide 74, is densified by subjecting the wafer 60 to an ambient of wet oxygen or steam at a temperature of 800° C. or thereabout for a period of about 30 minutes. The surface of the wafer 60 is next subjected to a planarization process, preferably chemical mechanical polishing (CMP). The CMP removes the extraneous filler material over the planar regions of the wafer and is accomplished until the surface of the wafer is polished into the pad nitride layer 68. The final wafer surface after CMP is represented in FIG. 4B by the dashed line 75. Alternative methods of planarization such as reactive ion etchback may also be employed. CMP and other planarization methods are well known and widely practiced. The filler oxide densification step may alternately be performed after the planarization step. Stress considerations which depend upon the filler material used may influence the preferred order of these two steps.

Figure 4D:
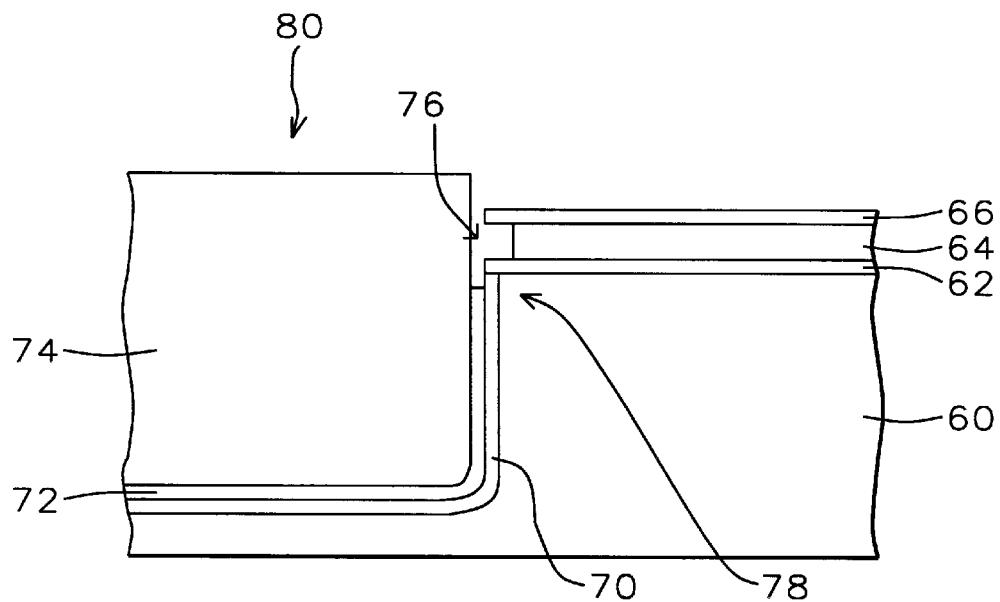

The remaining thick nitride 68 is next removed, preferably by wet etching in hot $H_3PO_4$. The etch stop layer 66 protects the thin nitride layer 64. However, an amount of undercut 76 is permitted to occur thereby exposing the corner region 78. The resultant cross section is shown in FIG. 4D. Care must be exercised in performing the wet etching steps to insure proper undercutting of the nitride and layers at their intersection in the region adjacent to the upper trench corner 78. The etch rate of $Si_3N_4$ in hot $H_3PO_4$ is controllable to the extent that the amount of undercutting may be adequately managed.

Figure 4E:
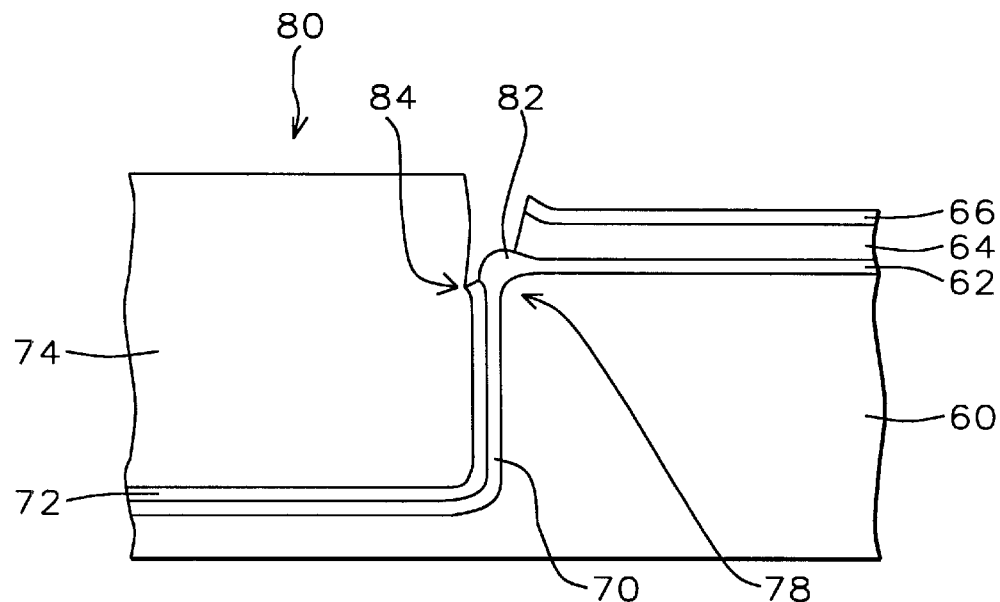

Referring now to FIG. 4E, the wafer 60 is subjected to an oxidation step wherein a oxide 82 is grown at the exposed silicon corner, thereby causing the corner to round off. The oxidation is preferably performed in dry oxygen at a temperature of between about 850 and 950° C. The formation of birdsbeak proceeds in both the horizontal and vertical directions from the corned 78. The growth process in the horizontal direction can be independently varied by changing the thickness of the thin nitride layer 64. The oxidation time and temperature may be determined and optimized by experiment to provide suitable corner rounding. It is found that an oxidation process that would normally grow between about 50 and 100 nm of silicon oxide on a planar <100> silicon surface provides a sufficient birdsbeak.

The growth of oxide between the silicon at the corner and the silicon nitride liner 72 is accompanied by a volume expansion of approximately a factor of 2. The pressure exerted on the end 84 of the silicon nitride liner 72 by the volume increase pushes the edge of the liner into the filler oxide 74 and thereby compensates for the tensile stress in the densified filler oxide 74 in the corner region.

After the dual birdsbeak oxide 82 is grown, the residual etch stop layer 66 is removed by wet etching with a calibrated etchant, for example, a 10:1 dilute HF solution. Care must be taken to avoid over etching by the wet etch. Suitable wet etchants having stable etch rates are widely used in the semiconductor industry and their means of calibration and utilization are well understood. Alternately a plasma etch may be used to remove the residual etch stop layer 66. Next the thin nitride layer 64 is removed by etching in hot $H_3PO_4$. Selective removal of silicon nitride layers by dissolution in hot $H_3PO_4$ is well known in the art and is widely practiced. Alternatively, a plasma etching technique may be employed whereby the pad oxide 62 is used as an etch stop.

The residual etch stop layer 66 may alternately be removed prior to the oxidation step wherein a oxide 82 is grown. In this instance, the portions of the trench oxide liner 70 and the pad oxide 62 exposed at the corner 78 are also removed.

Figure 4F:
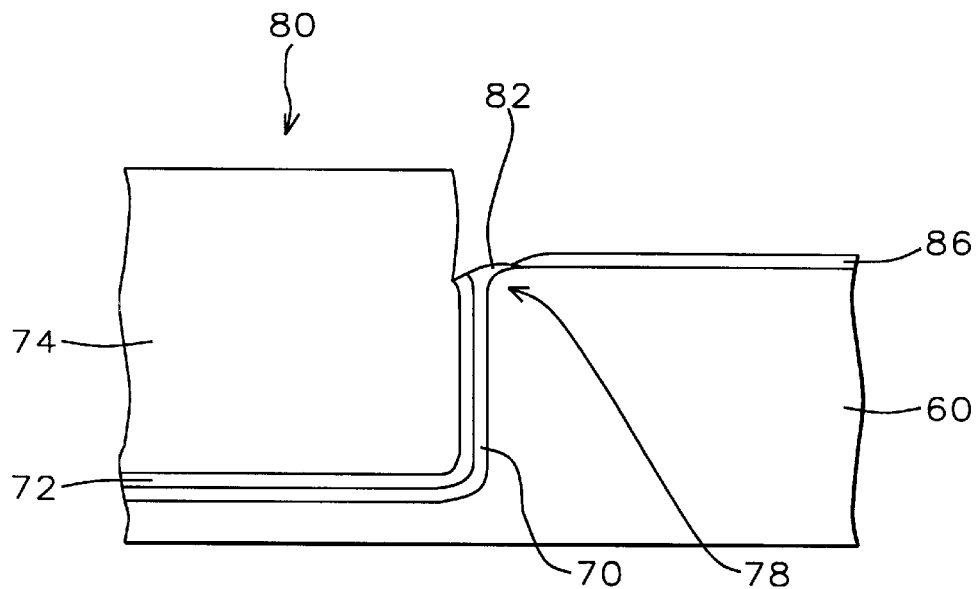

The pad oxide 62 itself is then removed by wet etching in dilute HF. The resultant cross section is shown in FIG. 4F. Care must again be exercised in performing the wet etching steps to avoid excessive removal of the birdsbeak oxide 82. A calibrated dilute HF etchant is preferably applied to etch only the planar portions of the oxide while leaving the deeper birdsbeak portions 82 intact. Suitable wet etchants having stable etch rates are widely used in the semiconductor industry and their means of calibration and utilization are well understood. After removal of the pad oxide film 62, a gate oxide 86 for the MOSFET devices is grown in the conventional manner. The gate oxide 86 adjoins the residual pocket 82 in an essentially smooth transition.

Following the formation of the gate oxide 86, a MOSFET is formed by patterning a gate electrode over the gate oxide 86, and forming source/drain regions in the silicon by well known customary procedures.

Figure 4G:
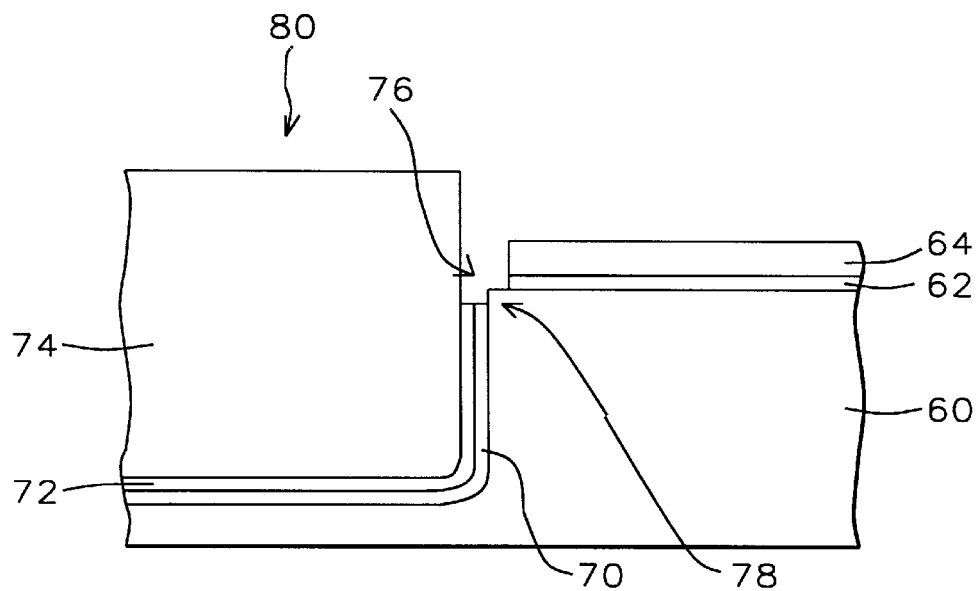

In a variation of the second embodiment, the etch stop oxide layer 66 shown in FIG. 4D is removed by wet etching with a calibrated HF etchant before the birdsbeak oxide 82 is grown. Referring to FIG. 4G, the wet etch removes all or part of the pad oxide 70 exposed in the corner region 78. An advantage of this variation of the second embodiment is that the subsequently grown birdsbeak oxide 82 is not exposed to the etch stop oxide 66 removal process.

Figure 5A:
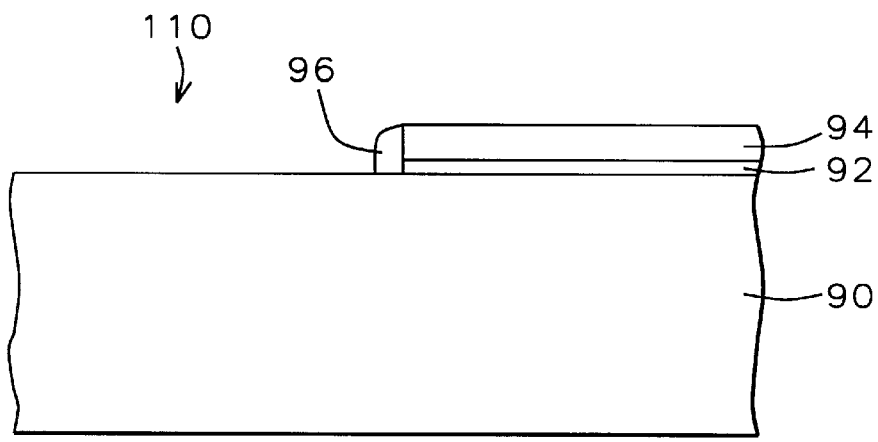
FIG. 5A through FIG. 5E are cross sections of a wafer showing the processing steps of a third embodiment of this invention.

In a third embodiment of this invention a sidewall spacer is used to define a region wherein a dual birdsbeak oxidation is performed which provides the corner rounding and stress relief benefits offered by this invention. A <100> oriented monocrystalline p-type silicon wafer is provided. Referring to FIG. 5A, there is shown a cross section of the silicon wafer 90. A layer of silicon oxide(pad oxide) 92 is thermally grown on the wafer 90 to a thickness of between about 10 and 20 nm. by subjecting the wafer to a clean dry oxidizing ambient in a furnace at between about 850 and 950° C. A silicon nitride layer (pad nitride) 94 between about 150 and 200 nm. thick is then deposited on the pad oxide layer 92, preferably by low pressure chemical vapor deposition (LPCVD).

An opening 110 is next patterned in the pad nitride layer 94 and the pad oxide layer 92 by conventional photolithographic methods well known to those in the art, thereby forming a hardmask. A silicon oxide sidewall 96 is then formed along the edges of the hardmask. Procedures for sidewall formation are well known in the art. The procedure consists of depositing a conformal layer of silicon oxide, preferably by LPCVD, over a surface having vertical features like the edges of the current hardmask. The thickness of the layer determines the width of the sidewall. Next the conformal silicon oxide layer is etched back anisotropically, for example by RIE, leaving oxide sidewall alongside the vertical edges. The silicon oxide sidewall structure in the current application will subsequently provide oxidation access for the formation of a dual birdsbeak structure.

The opening 110 in the hardmask, which is now defined by the lower lip of the oxide sidewall 96, is next extended to a depth of between about 270 and 450 nm into the silicon substrate 90 by RIE forming a shallow trench. The practice of etching essentially vertical walled trenches into silicon substrates is a well developed art and is typically accomplished by the use of etchant gases containing chlorine or $SF_6$.

Figure 5B:
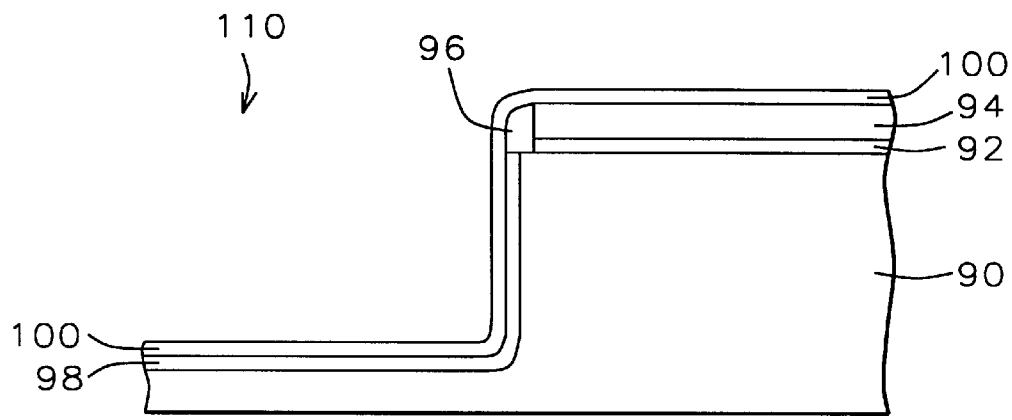

Referring now to FIG. 5B, a layer of silicon oxide 98 is next grown on the exposed surfaces within the trench. The silicon oxide layer 98 is grown in a clean dry oxidizing ambient in a furnace at between about 850 and 950° C. to a thickness of between about 10 and 20 nm. A silicon nitride layer 100 between about 20 and 60 nm. thick is then deposited conformally over the wafer, preferably by LPCVD. The nitride layer 100 serves to protect the clean oxide trench liner 98 from contamination in further processing and also acts as an oxidation barrier to prevent oxidation of the silicon trench walls during subsequent densification of the trench filler oxide.

Figure 5C:
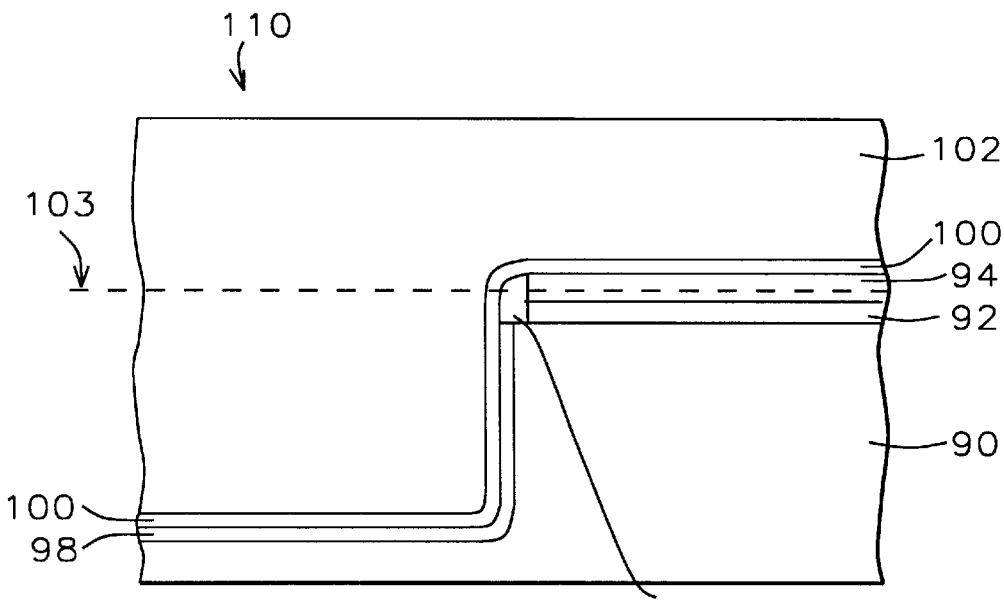

Referring to FIG. 5C, a layer of silicon oxide 102 is next deposited, preferably by LPCVD, filling the trench opening 110. The trench filling silicon oxide 102, is preferably deposited by the thermal decomposition of tetraethoxy orthosilicate(TEOS) which is conformal and may be accomplished at temperatures between 650 and 800° C. Optionally, other precursors, for example, $SiH_4$ and $O_2$ may be used to form the filler oxide 102. The trench filler material 102 may also consist of a substance other than silicon oxide, for example a silicate glass or polysilicon. The deposition procedures for these various materials is well understood by those practicing the art.

After deposition, the trench filling silicon oxide 102, is densified by subjecting the wafer 90 to an ambient of wet oxygen or steam at a temperature of 800° C. or thereabout for a period of about 30 minutes. The wafer 90 is next subjected to a surface planarization process, preferably chemical mechanical polishing (CMP). The final wafer surface after CMP is represented in FIG. 5C by the dashed line 103. The filler oxide densification step may alternately be performed after the planarization step. Stress considerations which depend upon the filler material used may influence the preferred sequence of these two steps.

The CMP is dispatched until the surface of the wafer is polished into the pad nitride layer 94 thereby also exposing the sidewall spacer 96. In order to adequately expose the sidewall 96, for it's subsequent removal, approximately half of the total pad nitride 94 should be polished away. The exposed spacer oxide 96 is then removed by etching in aqueous HF. The spacer 96 must be removed prior to the subsequent corner oxidation.

Figure 5D:
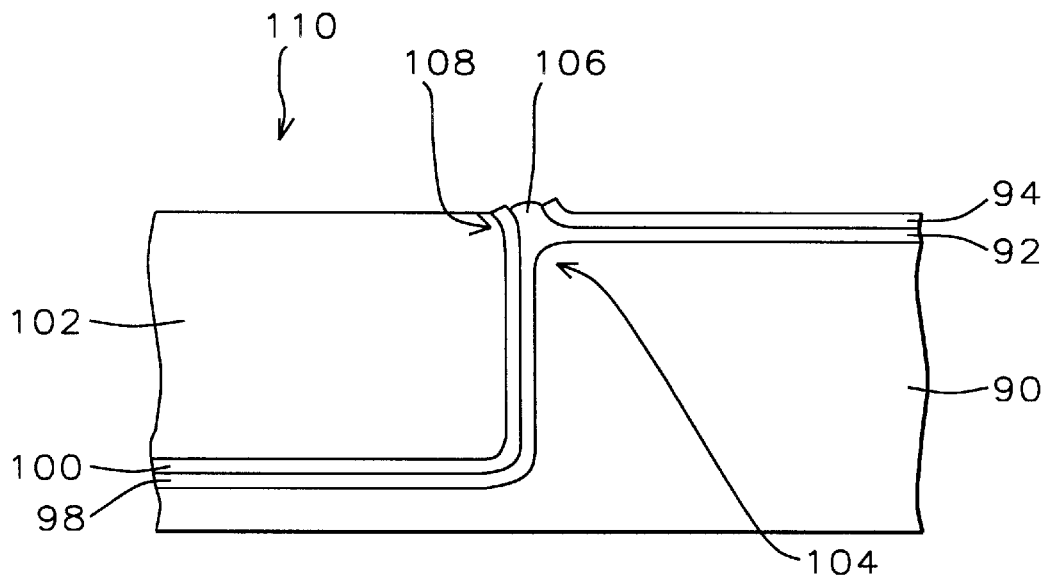

Referring now to FIG. 5D, the wafer 90 is subjected to an oxidation step wherein oxidation of the exposed silicon corner 104 causes the corner to become rounded and form the dual birdsbeak oxide structure 106. The oxidation is preferably performed in dry oxygen at a temperature of between about 850 and 950° C. The formation of birdsbeak proceeds in both the horizontal and vertical directions from the corned 104. The growth process in the horizontal direction can be independently varied by modifying the thickness of the pad nitride layer 94. The oxidation time and temperature may be determined and optimized by experiment to provide suitable corner rounding. It is found that an oxidation process that would normally grow between about 50 and 100 nm of silicon oxide on a planar <100> silicon surface provides a sufficient birdsbeak.

The growth of oxide between the silicon at the corner and the silicon nitride liner 100 is accompanied by a volume expansion of approximately a factor of 2. The pressure exerted on the end 108 of the silicon nitride liner 100 by the volume increase pushes the edge of the liner into the filler oxide 102 and thereby compensates for the tensile stress in the densified filler oxide 102 in the corner region.

After the dual birdsbeak oxide 106 is grown, the residual pad nitride layer 94 is removed by hot $H_3PO_4$. Selective removal of silicon nitride layers by dissolution in hot $H_3PO_4$ is well known in the art and is widely practiced. Alternatively, a plasma etching technique may be employed whereby the pad oxide 92 is used as an etch stop.

Figure 5E:
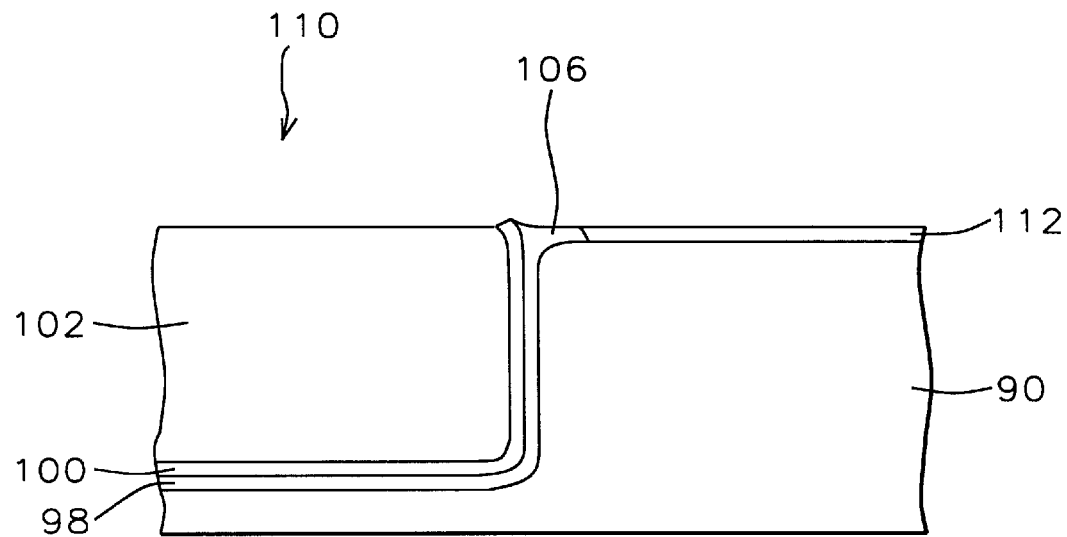

The pad oxide 92 itself is then removed by wet etching with a calibrated etchant containing HF. The resultant cross section is shown in FIG. 5E. Care must again be exercised in performing the wet etching steps to avoid excessive removal of the birdsbeak oxide 106. A calibrated dilute HF etchant is preferably applied to etch only the planar portions of the pad oxide 92 while leaving the deeper birdsbeak portions 110 intact. Suitable wet etchants having stable etch rates are widely used in the semiconductor industry and their means of calibration and utilization are well understood. After removal of the pad oxide 92, a gate oxide 112 for the MOSFET devices is grown in the conventional manner. The gate oxide 112 adjoins the residual pocket 106 in an essentially smooth transition.

Following the formation of the gate oxide 112, a MOSFET is formed by patterning a gate electrode over the gate oxide 112, and forming source/drain regions in the silicon by well known customary procedures.

While the invention has been particularly shown and described with reference to the preferred embodiments thereof, it will be understood by those skilled in the art that various changes in form and details may be made without departing from the spirit and scope of the invention.

While the embodiments of this invention utilize a p-type silicon substrate, an n-type silicon substrate could also be used without departing from the concepts therein provided.

What is claimed is:

1. A method for forming a MOSFET with shallow trench isolation on a silicon wafer comprising:
   (a) providing a silicon wafer;
   (b) forming a pad oxide on said wafer;
   (c) depositing a first silicon nitride layer on said pad oxide;
   (d) patterning said first silicon nitride layer and said pad oxide to define an opening exposing a silicon region;
   (e) anisotropically etching said silicon region in said opening, thereby forming a trench;
   (f) oxidizing said trench, thereby forming an oxide trench lining;
   (g) depositing a second silicon nitride layer over said silicon wafer;
   (h) depositing a layer of filler material over said silicon wafer, thereby filling said trench;
   (i) densifying said filler material;
   (j) planarizing said silicon wafer whereby said first silicon nitride layer is exposed;
   (k) etching said first silicon nitride layer;
   (l) etching said pad oxide;
   (m) oxidizing said silicon wafer, whereby a planar oxide layer and a vertical birdsbeak oxide penetrating the upper portion of said oxide trench lining are formed;
   (n) etching said planar oxide layer while retaining said birdsbeak oxide;
   (o) forming a gate oxide on said silicon wafer.
   (p) forming a gate over said gate oxide; and
   (q) forming source/drain regions on said silicon wafer, thereby forming a MOSFET.

2. The method of claim 1 wherein said filler material is taken from the group consisting of silicon oxide, a silicate glass, and polysilicon.

3. The method of claim 1 wherein said oxide trench lining is between about 10 and 20 nm. thick.

4. The method of claim 1 wherein said second silicon nitride layer is between about 20 and 60 nm. thick.

5. The method of claim 1 wherein said planar oxide is between about 20 and 100 nm. thick.

6. The method of claim 1 wherein said planar oxide is formed at a temperature of between about 850 and 950° C. in an ambient of dry oxygen.

7. A method for forming a MOSFET with shallow trench isolation on a silicon wafer comprising:
   (a) providing a silicon wafer;
   (b) forming a pad oxide on said wafer;
   (c) depositing a first silicon nitride layer on said pad oxide;
   (d) depositing an etch stop layer over said first silicon nitride layer;
   (e) depositing a second silicon nitride layer over said etch stop layer;
   (f) patterning said second silicon nitride layer, said etch stop layer, said first silicon nitride layer, and said pad oxide to define an opening exposing a silicon region;
   (g) anisotropically etching said silicon region in said opening, thereby forming a trench;
   (h) oxidizing said trench, thereby forming a silicon oxide trench lining;
   (i) depositing a third silicon nitride layer over said silicon wafer;
   (j) depositing a layer of filler material over said silicon wafer, thereby filling said trench;
   (k) densifying said filler material;
   (l) planarizing said silicon wafer whereby said second silicon nitride layer is exposed;
   (m) etching said second silicon nitride layer and a portion of said third silicon nitride layer thereby forming an undercut in said first silicon nitride layer;
   (n) oxidizing said silicon wafer, whereby an oxide pocket is formed with a birdsbeak portion extending horizontally, penetrating said pad oxide, under said first silicon nitride layer and vertically, penetrating said silicon oxide trench lining, under said third silicon nitride layer;

(o) removing said etch stop layer;

(p) removing said first silicon nitride layer;

(q) etching said pad oxide and said oxide pocket while retaining said birdsbeak portion;

(r) forming a gate oxide on said silicon wafer.

(s) forming a gate electrode over said gate oxide; and (t) forming source/drain regions on said silicon wafer, thereby forming a MOSFET.

8. The method of claim 7 wherein said filler material is taken from the group consisting of silicon oxide, a silicate glass, and polysilicon.

9. The method of claim 7 wherein said silicon oxide trench lining is between about 10 and 20 nm. thick.

10. The method of claim 7 wherein said first silicon nitride layer is between about 50 and 100 nm. thick.

11. The method of claim 7 wherein said third silicon nitride layer is between about 20 and 60 nm. thick.

12. The method of claim 7 wherein said etch stop layer is taken from the group consisting of silicon oxide and polysilicon.

13. The method of claim 7 wherein said oxide pocket is formed at a temperature of between about 850 and 950° C. in an ambient of dry oxygen.

14. The method of claim 7 wherein step (o) is performed after step (m) and before step (n).

15. The method of claim 7 further comprising etching said pad oxide in said undercut after step (m) and before step (n).

16. A method for forming a MOSFET with shallow trench isolation on a silicon wafer comprising:

(a) providing a silicon wafer;

(b) forming a pad oxide on said wafer;

(c) depositing a first silicon nitride layer on said pad oxide;

(d) patterning an opening in said first silicon nitride layer and said pad oxide exposing a silicon region;

(e) forming a sidewall along the perimeter of said opening;

(f) anisotropically etching said silicon region in said opening, thereby forming a trench;

(g) oxidizing said trench, thereby forming a silicon oxide trench lining;

(h) depositing a second silicon nitride layer over said silicon wafer;

(i) depositing a layer of filler material over said silicon wafer, thereby filling said trench;

(j) densifying said filler material;

(k) planarizing said silicon wafer to expose said first silicon nitride layer and said sidewall;

(l) etching said sidewall;

(m) oxidizing said silicon wafer, whereby an oxide pocket is formed with a birdsbeak portion extending horizontally, penetrating said pad oxide, under said first silicon nitride layer and vertically, penetrating said silicon oxide trench lining, under said third silicon nitride layer;

(n) removing said first silicon nitride layer;

(o) etching said pad oxide and said oxide pocket while retaining said birdsbeak portion;

(p) forming a gate oxide on said silicon wafer.

(q) forming a gate electrode over said gate oxide; and (r) forming source/drain regions on said silicon wafer, thereby forming a MOSFET.

17. The method of claim 16 wherein said filler material is taken from the group consisting of silicon oxide, a silicate glass, and polysilicon.

18. The method of claim 16 wherein said silicon oxide trench lining is between about 10 and 20 nm. thick.

19. The method of claim 16 herein said first silicon nitride layer is between about 20 and 30 nm. thick.

20. The method of claim 16 wherein said second silicon nitride layer is between about 20 and 60 nm. thick.

21. The method of claim 16 wherein said oxide pocket is formed at a temperature of between about 850 and 900° C. in an ambient of dry oxygen.

22. The method of claim 16 wherein said sidewall is etched in aqueous HF.

* * * * *